United States Patent
Deshmukh et al.

(10) Patent No.: US 6,520,197 B2
(45) Date of Patent: Feb. 18, 2003

(54) CONTINUOUS LAMINAR FLUID MIXING IN MICRO-ELECTROMECHANICAL SYSTEMS

(75) Inventors: Ajay Deshmukh, Southampton, PA (US); Dorian Liepmann, Lafayette, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/867,942

(22) Filed: May 30, 2001

(65) Prior Publication Data

US 2001/0055242 A1 Dec. 27, 2001

Related U.S. Application Data

(60) Provisional application No. 60/209,161, filed on Jun. 2, 2000.

(51) Int. Cl.[7] .................................................. F15C 1/04
(52) U.S. Cl. ............................ 137/3; 137/826; 137/828; 137/833; 417/208
(58) Field of Search ................................. 137/828, 826, 137/833, 3, 341; 347/65, 85; 422/100; 251/11; 417/208, 209

(56) References Cited

U.S. PATENT DOCUMENTS

| | | | | |
|---|---|---|---|---|
| 3,566,904 A | * | 3/1971 | Davis | 137/403 |
| 5,716,852 A | | 2/1998 | Yager et al. | 436/172 |
| 6,062,681 A | * | 5/2000 | Field et al. | 347/65 |
| 6,065,864 A | | 5/2000 | Evans et al. | |
| 6,283,718 B1 | * | 9/2001 | Prosperetti et al. | 417/52 |

FOREIGN PATENT DOCUMENTS

| | | |
|---|---|---|
| WO | WO/ 98/24496 | 6/1998 |
| WO | PCT/US01/17985 | 6/2001 |

OTHER PUBLICATIONS

Li et al., "A High Frequency High Flow Rate Piezoelectrically Driven Mems Micropump", Solid–State Sensor and Actuator Workshop, Hilton Head Island, South Carolina, Jun. 4–8, 2000, pp. 69–72.

Jaeggi et al., "Novel Interconnection Technologies For Integrated MicroFluidic Systems", Solid–State Sensor and Actuator Workshop, Hilton Head Island, South Carolina, Jun. 8–11, 1998, pp. 112–115.

Evans et al., "Planar Laminar Mixer", 1997 IEEE, pp. 96–101.

Papavasiliou et al., "Fabrication of a Free Floating Silicon Gate Valve", IMECE, Nov. 14–19, 1999, pp. 1–6.

* cited by examiner

*Primary Examiner*—A. Michael Chambers
(74) *Attorney, Agent, or Firm*—Pennie & Edmonds LLP (57) ABSTRACT

A micro-electromechanical system and method for continuous laminar fluid mixing. An embodiment of the invention described in the specification includes a mixing channel, a first delivery channel that is connected to the mixing channel, and a second delivery channel that is connected to the mixing channel. A first pump mechanism produces pulses in the first delivery channel. A second pump mechanism produces pulses in the second delivery channel. The first pulsed fluid stream and the second pulsed fluid stream merge in the mixing channel to form a mixed fluid. The pulses in the fluids operate to distort the interface between the fluids to facilitate diffusion between the fluids.

31 Claims, 5 Drawing Sheets

CONTINUOUS LAMINAR FLUID MIXING IN MICRO-ELECTROMECHANICAL SYSTEMS

The present application claims the priority of U.S. provisional patent application bearing Ser. No. 60/209,161, filed Jun. 2, 2000.

This invention was made with Government support under Grant (Contract) No. F33615-97-1-2730, awarded by the Defense Advanced Research Projects Agency (DARPA). The Government has certain rights to this invention.

BRIEF DESCRIPTION OF THE INVENTION

This invention relates generally to micro-electromechanical systems (MEMS). More particularly, this invention relates to the use of MEMS for mixing one or more fluids.

BACKGROUND OF THE INVENTION

Micro-electromechanical systems (MEMS), which are sometimes called micromechanical devices, micromachines, micro-fabricated devices or nano-structures, are three dimensional objects having one or more dimensions ranging from microns to millimeters in size. The devices are generally fabricated utilizing semiconductor processing techniques, such as lithographic technologies.

The use of MEMS to mix one or more fluids has numerous applications in industries ranging from chemical analysis, to printing, to medicine. As used herein, the term "mixing" refers to combining two fluids, increasing the uniformity of a single fluid, decreasing the special or temporal gradients with respect to one or more fluid properties, or increasing small scale decomposed structure from large scale homogenous structure in a fluid.

As previously indicated, there are numerous applications for fluid mixing MEMS. For example, a device capable of mixing, and thereby processing, tens to hundreds of nano-liters of fluid would increase by two orders of magnitude the number of chemical tests that can be performed on a given volume of fluid. In printing, fluid-handling MEMS would allow for the mixing of inks "off-paper", thereby allowing for on-demand ink formation, increasing the print quality and decreasing the amount of ink required. In medicine, fluid-handling MEMS could be implanted under the skin, or incorporated in micro fabricated needles, and programmed to mix and dispense assays according to current need or a pre-programmed schedule. Numerous additional applications exist for fluid-handling MEMS.

The ability to mix fluids thoroughly and in a reasonable amount of time is fundamental to the creation of fully integrated, "on-chip" MEMS fluid processing systems. Effective mixing of fluids requires that the fluids be manipulated or directed so that the contact area between the fluids is increased. In macroscopic devices this is generally done using turbulence, three-dimensional flow structures, or mechanical actuators. In MEMS, however, it is often difficult and expensive to use such means to effect efficient fluid mixing. MEMS are typically fabricated in a lithographic environment, the design constraints of which mitigate against mechanical actuators. Furthermore, MEMS are essentially planar devices, with the X and Y axes defining the plane of the device. The design of structures in the third-dimensional Z axis (or vertical axis orthogonal to the plane defined by the X and Y axes) is constrained by lithographic techniques. For example, lithographic techniques limit the Z-axis structures to uniform shape and depth throughout the device. As a result, the Z-axis dependence of the flow field will be uniform (e.g., parabolic) throughout the planar device. A flow with uniform Z dependence is referred to as planar flow. It is difficult to achieve mixing in this context.

The size and proportions of MEMS generally preclude relying on either turbulence or diffusion alone as mixing mechanisms. The size of fluid chambers in a MEMS can range from the picoliter, $(10 \ \mu m)^3$, to the microliter, $mm^3$, range. Though fabrication constraints allow for picoliter chambers, few commonly used fluids are concentrated enough to be useful in such quantities. An upper bound on volumes of about $50 \ \mu l$ is set by the size of a typical device ($10 \ mm \times 10 \ mm \times 500 \ \mu m$). Process volumes in the 100 nanoliter range allow multiple chambers to be fabricated on one die, yet provide sufficient fluid for many applications.

Turbulence occurs in flows characterized by high Reynolds numbers, defined as $$Re = (U\delta)/v, \quad [1]$$

where U is a characteristic velocity, $\delta$ is a length scale, and v is the kinematic viscosity ($1 \ mm^2/s$ for water). The appropriate length scale, typically the channel height, will in general be smaller than $500 \ \mu m$. Assuming the highest velocity to be experienced for on-chip flows is one die length per second (U=10 mm/s), an upper bound on the Reynolds number is Re=5, with typical values being much lower. As turbulence in channel flow occurs only for Re>2000, on-chip flows are expected to be laminar, and thus turbulence is not available as a mixing mechanism. Moreover, flows with Re<<1, known as creeping flows, are symmetric and reversible. In this regime, a flow moving past an object will reconstitute itself, passing by the object unchanged, and "mixing" caused by a given set of manipulations to the fluid can be undone simply be reversing the set of manipulations. This precludes the use of barrier-fields, complex geometries, and severely limits the usefulness of mechanical actuators.

Similarly, the size and shape of MEMS limit the usefulness of diffusion as a sole mechanism for mixing. As it is difficult to place two fluids on top of each other in a planar MEMS, the length over which diffusion must act will be the in-plane dimension of the fluid chamber. Using Fick's equation, a diffusion mixing time scale, $T_D$ can be formed $$T_D = L^2/k, \quad [2]$$

where L is the relevant mixing length, and k is the Fickian diffusion constant ($k=10^3 \ \mu m^2/s$ for salt in water, for example). Using L=1 mm, $T_D=10^3$ seconds=16.6 minutes. Even for $L=100 \ \mu m$, $T_D=10$ seconds. Such mixing times are generally too slow to rely on diffusion for effective mixing.

U.S. Pat. No. 6,065,864 (the '864 patent), which is assigned to the assignee of the present invention and is incorporated by reference herein, discloses seminal work in connection with the use of MEMS for planar laminar mixing. The planar laminar mixing technology described in the '864 patent is directed toward batch and is generally not as fast and efficient as continuous processing. Accordingly, it would be desirable to provide an improved planar laminar mixing technique to mix fluids in a MEMS.

SUMMARY OF THE INVENTION

An embodiment of the present invention is a micro-electromechanical system that includes a first channel for carrying a first stream of fluid, a second channel for carrying a second stream of fluid, and a mixing channel coupled to the first channel and the second channel to receive the streams.

The micro-electromechanical device includes mechanisms for generating pulses in the first stream and the second stream such that, when the first stream and the second stream enter the mixing channel, the interface between the two streams becomes distorted. The distorted interface operates to facilitate diffusion between the two streams.

Another embodiment of the present invention is a method of mixing fluids in a micro-electromechanical system. The method includes the steps of: producing pulses in a first stream of fluid, creating pulses in a second stream of fluid, and merging the first stream of fluid and a second stream of fluid in a mixing channel. The pulses, which may be generated according to the dimensions of the mixing channel, distort an interface between the first stream and the second stream to facilitate diffusion between the two streams.

The invention further provides an efficient technique for mixing fluids in a micro-electromechanical system. Mixing is achieved in a two dimensional velocity field without turbulence. The invention facilitates continuous laminar fluid mixing. The pumps of the invention operate to vary the ratio(s) of the mixed fluids and to control the flow rate of the mixture.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DESCRIPTION OF THE PREFERRED EMBODIMENTS

Figure 1:
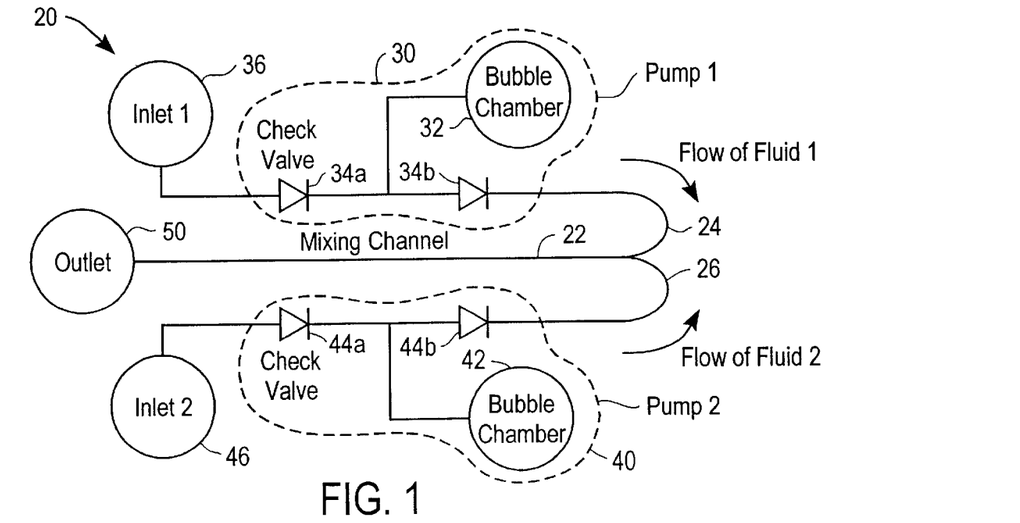
FIG. 1 is a schematic of a continuous laminar fluid mixing apparatus in accordance with the invention.

FIG. 1 is a schematic of a laminar fluid mixing apparatus 20 constructed in accordance with an embodiment of the invention. The apparatus 20 includes a mixing channel 22, which receives fluid from a first delivery channel 24 and a second delivery channel 26. Fluid flow in the first delivery channel 24 is controlled by a first pump mechanism 30. Fluid is supplied to the first delivery channel 24 via a first inlet 36. Fluid flow in the second delivery channel 26 is controlled by a second pump mechanism 40. Fluid is supplied to the second delivery channel 26 via a second inlet 46. The fluid from the mixing channel 22 is delivered to an outlet 50.

Figure 2:
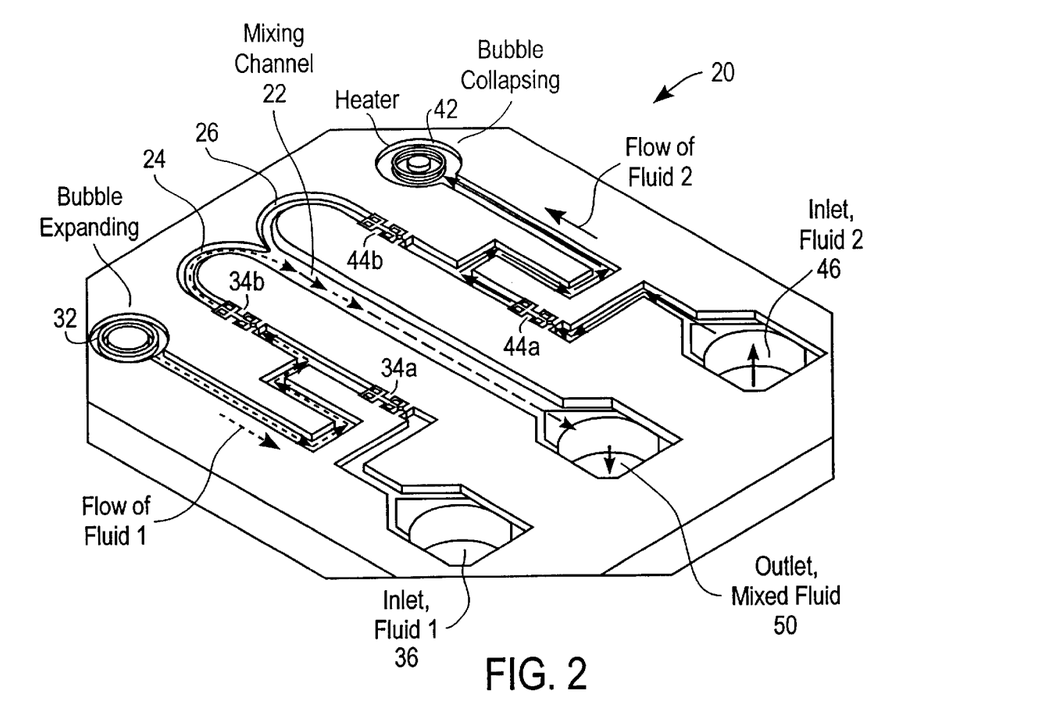
FIG. 2 is a perspective view of a fabricated continuous laminar fluid mixing apparatus in accordance with the invention.

FIG. 2 illustrates the components of the laminar fluid mixing apparatus 20 of FIG. 1, as fabricated in a semiconductor substrate. The fabrication of this device is discussed below.

Figure 3:
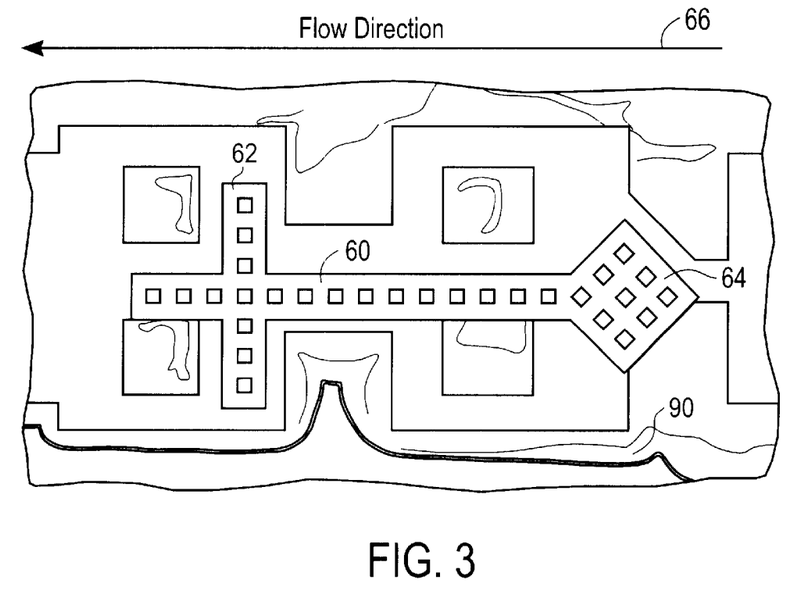
FIG. 3 illustrates a check valve that may be used in accordance with an embodiment of the invention.

FIG. 3 illustrates a free-standing check valve 60 that may be used in accordance with an embodiment of the present invention. The check valve 60 includes a blocking plate structure 62 and a blocking wedge structure 64. When fluid is applied to the "left side" of the check valve 60, the blocking plate structure 62 and the blocking wedge structure 64 are forced against matching surfaces to prevent further fluid flow. Conversely, the structure of the check valve 60 allows fluid to flow from right-to-left, as indicated by arrow 66. Structures and fabrication techniques for constructing free-standing valves of this type are described in U.S. Ser. No. 09/309,316, filed May 11, 1999, entitled "Apparatus and Method for Controlling Fluid with an Unattached Micromechanical Block," which is incorporated by reference herein.

With reference again to FIG. 1, the first pump mechanism 30 includes bubble chamber 32 and two free-standing check valves 34a–34b, and the second pump mechanism 40 includes bubble chamber 42 and two free-standing check valves 44a–44b. The bubble chambers 32 and 42 each may include a heater for evaporating small amounts fluid to form bubbles. Bubbles thus generated will push the fluid out of the bubble chambers 32, 42 into the first and second delivery channels 24, 26 and the mixing channels 22. When the heater is turned off, the bubble will re-condense and collapse, causing fluid to be drawn into the bubble chamber from the first and second delivery channels 24, 26 and the inlets 36, 46.

Note that bubble chambers 32 and 42 do not have to generate bubbles by heat. In other embodiments of the invention, bubbles may be formed electrolytically. Techniques for electrolytically forming bubbles are described in the previously cited U.S. patent application Ser. No. 09/309, 316.

Observe that bubble chamber 32 is situated between two check valves 34a–34b, and bubble chamber 42 is situated between two check values 44a–44b. In the present embodiment, the check valves 34a–34b and 44a–44b are free-standing check valves similar to check valve 60. As such, the check valves 34a–34b each allow fluid flow in one direction. As fluid is pushed out from bubble chamber 32, the fluid will flow out of check valve 34b. When the bubble collapses in bubble chamber 32, fluid will be drawn in through the other check valve 34a. Likewise, fluid is pushed out from bubble chamber 42 through check valve 44b and is drawn in through check valve 44a. Running the cycle repeatedly results in a net flow of fluid. Just as importantly, the fluid will exit as a series of pulses. By cycling two bubble chambers 32 and 42 out of phase (generating a bubble in one chamber while collapsing it in the other), two out-of-phased trains of pulses will be formed.

In some embodiments of the present invention, pump mechanisms 30 and 40 may use oscillating piston type devices other than the bubble chambers 32 and 42 described above. In other embodiments, pump mechanisms 30 and 40 may not be oscillating piston type devices at all. In those embodiments, the effect of cycling two oscillating piston-type pumps can be achieved by cycling two actuated valves. Micro-electromechanical actuated valves that may be used as check values 34a–34b and 44a–44b are described in co-pending U.S. patent application Ser. No. 09/587,040 and entitled "Apparatus and Method for Controlling Physical Motion with Electrolytically Formed Bubbles," which is hereby incorporated by reference.

With reference again to FIGS. 1 and 2, regardless of the implementation, the two pulsed fluid streams enter the mixing channel 22 in a preferably alternating sequence. As the fluid is carried down the mixing channel 22, the pulses of fluid are stretched due to the fact that the velocity is greater in the center of the channel than at the edges. By the end of the mixing channel 22, the interface between the two fluids becomes extremely distorted and lengthened, thereby facilitating diffusion between the fluids. By varying the timing and/or duty cycles of the two pump mechanisms 30 and 40, different exit ratios for the two fluids can be achieved.

The invention is applicable to microscale fluidic devices, where fluid channels have widths on the order of 1–100 µm. At this scale, mixing by turbulence is not feasible. In addition, since the devices are inherently planar (without an appreciable Z-axis dimension), it is difficult to exploit three-dimensional flow fields. Note that the present invention does not require the generation of at least two pulsed fluid streams. Rather, in some embodiments of the present invention, efficient diffusion between two fluids can also be achieved by generating pulses in a single fluid stream and merging the pulsed stream with a non-pulsed stream.

Figure 4:
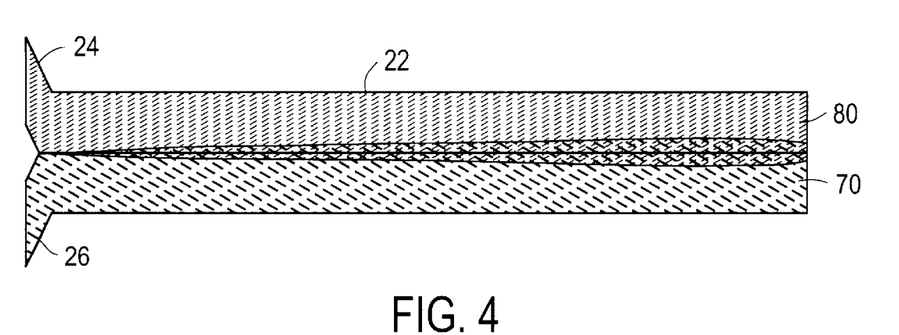
FIG. 4 illustrates the interaction between two fluids in a non-pulsed environment.

FIG. 4 illustrates the operation of a mixing channel 22 in the absence of pulsed fluids. In particular, FIG. 4 illustrates the first delivery channel 24 supplying a white fluid 80 to the mixing channel 22 and the second delivery channel 26 supplying a black fluid 70 to the mixing channel 22. By way of example, the delivery channels 24 and 26 are 3 mm long and 200 µm wide. The mixing channel 22 is 5 mm long and 400 µm wide. Note that FIGS. 4–9 are not drawn to scale.

FIGS. 4–9 are based upon a Computational Fluid Dynamics (CFD) model. In particular, FIGS. 4–9 are generated using CFD-ACE software from CFD Research Corporation. The white fluid 80 represents pure water, while the black fluid 70 represents water with glucose dissolved in it. A Schmidt number, which is viscosity divided by the diffusion rate, of 1449.3 was used. Shades of gray represent concentrations between zero (white) and the maximum at the lower inlet (black). There is a line along the center of the channel that is an artifact of the modeling software; it is not related to the glucose concentration or physical features of the mixing channel 22.

In the following examples, the fluid velocity field was originally generated by supplying an 8 Pa pressure at both inlets and a 0 Pa pressure at the outlet. After a steady state solution was reached, each inlet was kept at either 8 Pa (corresponding to an open valve) or zero velocity (corresponding to a closed valve) with the two inlets always in opposite states. In the following examples, the valves are cycled at 3 Hz, so each one is open or closed for ⅙ second.

In FIG. 4, some mixing due to diffusion exists, as can be seen by the blurring of the interface into shades of gray at the exit of the channel 22. Observe that the amount of mixing is very small.

Figure 5:
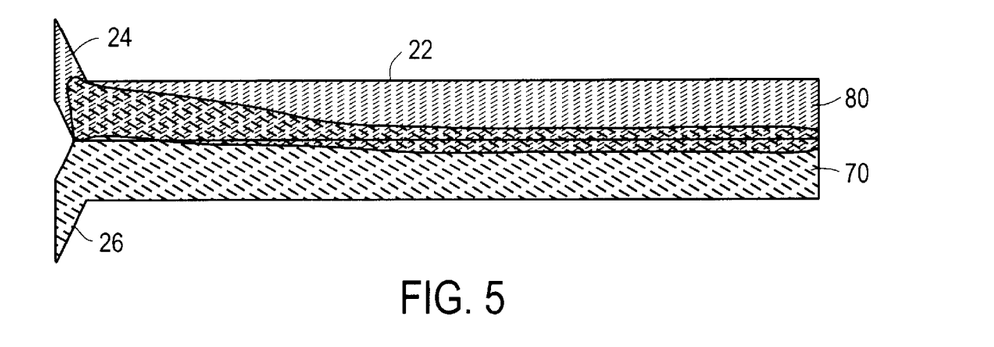
FIGS. 5–9 illustrate diffusion sequences achieved in accordance with embodiments of the invention.

FIG. 5 shows the result of having the top fluid valve closed for ⅙ of a second. A pulse of black fluid can be seen to have pushed into the top half of the exit channel.

Figure 6:
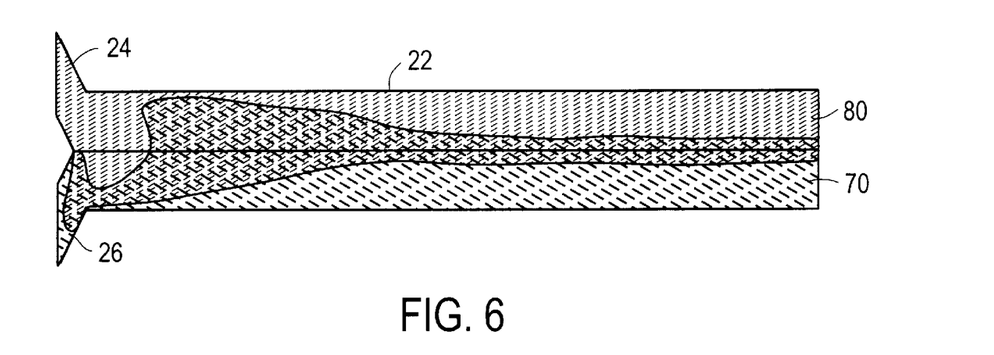

FIG. 6 portrays the result another ⅙ of a second later as the valve operation has been switched. In this case, the white fluid has entered the exit channel. Also, the black pulse can be seen to have become slightly distorted due to the faster velocities along the centerline.

Figure 7:
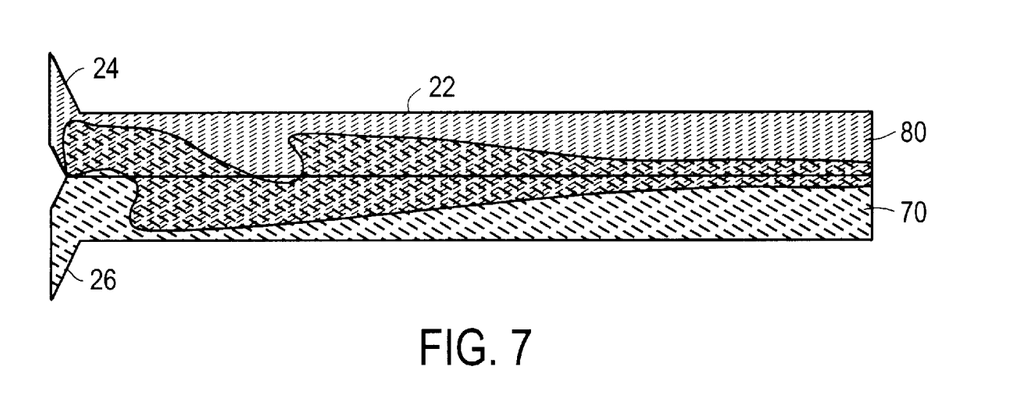
Figure 8:
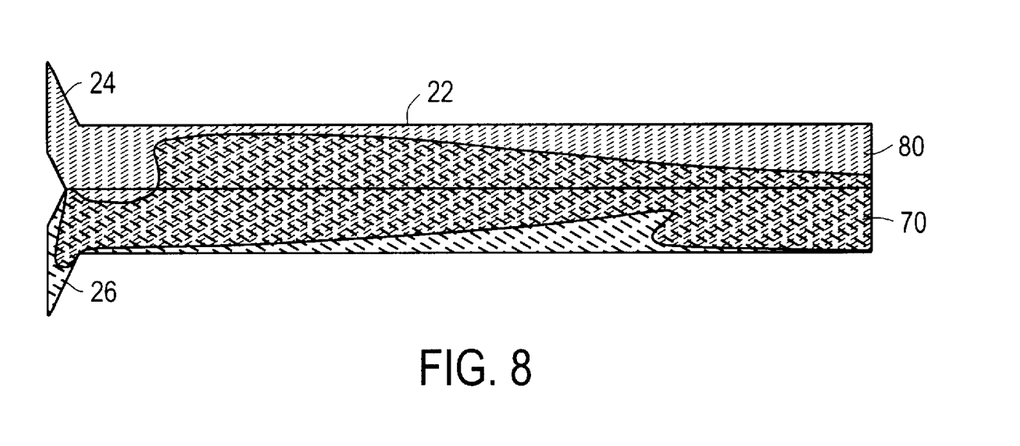

FIGS. 7 and 8 show successive ⅙ second pulses. As each pulse moves downstream, it gets further distorted and diffused.

Figure 9:
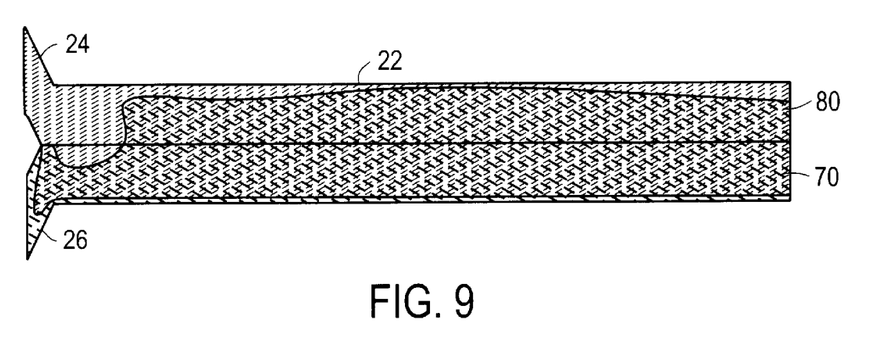

FIG. 9 illustrates the channel 2 seconds (or twelve pulses) after the start. Although not quite a steady state solution, every ⅓ of a second after this point, the fluid will look the same. The exiting fluid can be seen to be much better mixed than the exiting fluid in FIG. 4.

The process can be optimized in several ways, depending on the application. The rate at which the valves are cycled will affect the size of each pulse. If pulses are too small, the interface will not deviate much from the centerline and if the pulses are too large, there will be large plugs of fluid with only a small interface between them; neither case will lead to satisfactory mixing. An ideal pulse will push close to the far wall but not grow much after that. The valve timing that will generate such a pulse will be determined by the flow rate, channel geometry, etc., and therefore will be application specific.

The valve timing can be further manipulated to reduce the flow rate from the maximum possible with both valves open and/or to generate a desired exit concentration between that of the two inlet concentrations.

An embodiment of the present invention has been fabricated using Silicon-on-Insulator (SOI) and quartz wafers bonded together. In this embodiment, bubbles are created by polysilicon resistors on quartz, which act as heaters. Furthermore, in this embodiment, the polysilicon resistors are fabricated as adjacent hexagons, thereby forming a honeycomb configuration. In one embodiment, each hexagon is approximately 50 µm wide.

According to the present embodiment, the SOI wafer has a 2 micron thick buried oxide layer and a 75 micron device layer. Two sequential Deep Reactive Ion Etches (DRIE) are performed on the SOI wafer. The first DRIE etches all the way through the SOI wafer to form through holes, while the second DRIE goes only through the device layer to create the channels. A 1.3 micron thick wet oxide layer provides the mask for the second DRIE while a layer of 9.5 micron thick photoresist over the oxide serves as the mask for the first DRIE. After the DRIE processes, the valves are almost completely freed from the substrate in HF. They are then placed in $H_2O_2$ to generate a thin oxide layer on the bottom of the valve. Afterwards, a probe tip is used to gently free the valves.

The quartz wafer has doped polysilicon and sputtered aluminum applied, both of around 0.3 micron thickness. The layers, after being patterned into heaters, are passivated with silicon oxide and/or silicon nitride, leaving openings for the electrical connections. A novel process for bonding is used to attach the quartz cover plate. A low viscosity epoxy (Epotek 301) is spun on at 10,000 rpm, with tape applied to the electrical contacts to prevent epoxy from covering them. The two dices are then "flip-chipped" with pressures of between 100–300 kPa per die. The epoxy bonds and seals the dies, but also traps the valve bodies.

An oxygen plasma (200 W in 600 mtorr of $O_2$) is used to remove the epoxy in the fluid channels. Through holes allow the plasma to access the fluid channels. The oxygen first removes the epoxy on the top of the channels. The plasma then ashes the epoxy in between the silicon and the quartz. It then moves slowly outward from the channel. The plasma etching is timed to free the valves without penetrating far from the channel edge. The valves are freed, but sufficient epoxy remains outside the channels to bond and seal the device.

FIG. 3 illustrates the edge of the epoxy layer 90. The epoxy has been etched farther above the channel than below it, possibly due to non-uniformity in the epoxy layer. Once the valves are free, the devices are placed in an $H_2O_2$ and surfactant ultrasound bath in order to create an oxide layer surrounding the valve bodies.

Figure 10:
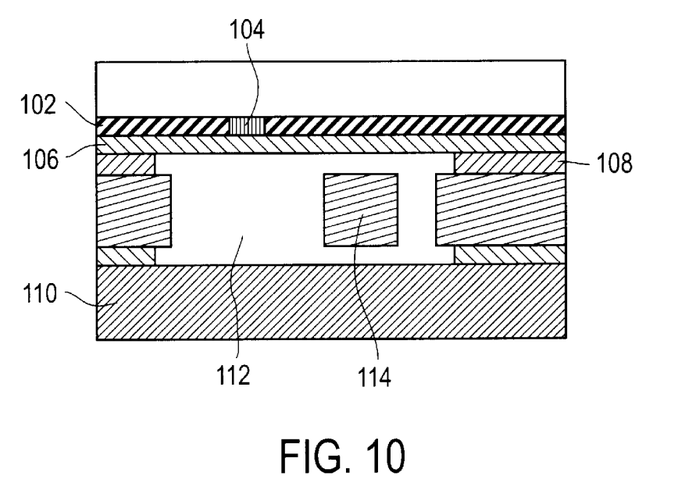
FIG. 10 is a cross-sectional view of an apparatus constructed in accordance with an embodiment of the invention.

An illustrative cross-section of the device of the invention is shown in FIG. 10.

FIG. 10 does not correspond to any actual cross-section in the device, but operates to illustrate the combination of the heater and valve structures. FIG. 10 illustrates a quartz layer 100 above an aluminum layer 102, which includes a polysilicon heater 104. FIG. 10 also illustrates an oxide layer 106 and epoxy regions 108. Within the silicon substrate 110 a fluid channel 112 is formed. The fluid channel 112 includes a moving structure 114.

The apparatus of the invention has been constructed to produce peak fluid flows of approximately 15 mm/sec. In operation, the check valves may vibrate from a secondary oscillation in the fluid flow. This oscillation is due to an instability that causes the bubble to fluctuate in size when the power is on. This secondary oscillation not only causes the valve body to move, but also enhances the pumping force.

Flow rates of approximately 5 microliters/min have been attained using pumping frequencies of approximately 0.5 Hz. The pump heaters require 1 to 4 Watts to thermally generate a bubble, but the average power is lower. While this is higher than desired, several optimization strategies for lower power consumption are possible. For example, if the desired flow rate is low, the pumps can be operated more slowly with the heaters off longer than on. Better thermal isolation of the heater and bubble chamber will reduce heat loss to the substrate. Electrolysis bubbles may also be used.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of continuous laminar fluid mixing in a micro-electromechanical system that includes a first channel, a second channel and a third channel coupled to the first channel and the second channel, the method comprising:

producing first pulses in a first fluid carried by the first channel;

creating second pulses in a second fluid carried by the second channel;

merging the first fluid and the second fluid in the third channel as the first and second fluids travel through the third channel to an exit of the third channel so as to continuously form a third fluid, wherein the first pulses and the second pulses distort an interface between the first fluid and the second fluid to facilitate diffusion across the interface.

2. The method of claim 1, wherein the producing and the creating comprise forming bubbles to produce pulsed fluid motion.

3. The method of claim 2, wherein the forming comprises forming bubbles to produce pulsed fluid motion thermally.

4. The method of claim 2, wherein the forming comprises forming bubbles to produce pulsed fluid motion electrolytically.

5. A micro-electromechanical system, comprising:

a first channel configured to carry a first stream of fluid;

a mechanism configured to create pulses in the first stream of fluid;

a second channel configured to carry a second stream of fluid; and a third channel coupled to the first channel and the second channel to receive the first stream and the second stream, wherein the first stream and the second stream mix in the third channel as the first and second streams travel through the third channel to an exit of the third channel so as to continuously form a third stream of fluid, and wherein the pulses in the first stream facilitates diffusion between the first stream and the second stream.

6. The system of claim 5, wherein the mechanism comprises:

a pump configured to push fluid into the third channel; and a valve positioned between the pump and the third channel and configured to permit fluid flow into the third channel when the valve is open and prevent fluid flow out of the third channel when the valve is closed.

7. The system of claim 6, wherein the valve comprises a free-standing check valve.

8. The system of claim 6, wherein the valve comprises a powered check valve.

9. The system of claim 6, wherein the pump comprises a bubble chamber configured to create bubbles thermally to push fluid into the third channel.

10. The system of claim 6, wherein the pump comprises a bubble chamber configured to create bubbles electrolytically to push fluid into the third channel.

11. A micro-electromechanical system, comprising:

a first channel configured to carry a first stream of fluid;

a first mechanism configured to create first pulses in the first stream of fluid;

a second channel configured to carry a second stream of fluid;

a second mechanism configured to create second pulses in the second stream of fluid; and a third channel coupled to the first channel and the second channel to receive the first stream and the second stream, wherein the first stream and the second stream mix in the third channel as the first and second streams travel through the third channel to an exit of the third channel so as to continuously form a third stream of fluid, and wherein the first pulses and the second pulses distort an interface between the first stream and the second stream to facilitate diffusion between the first stream and the second stream.

12. The system of claim 11, wherein the first mechanism comprises:

a first pump configured to push the first stream of fluid into the third channel; and a first valve positioned between the first pump and the third channel and configured to permit fluid flow across the first valve into the third channel when the first valve is open and prevent fluid flow across the first valve when the first valve is closed.

13. The system of claim 12, wherein the second mechanism comprises:

a second pump configured to push the second stream of fluid into the third channel; and a second valve positioned between the second pump and the third channel and configured to operate synchronously with the first valve to permit fluid flow across the second valve when the first valve is closed and prevent fluid flow across the second valve when the first valve is open.

14. The system of claim 13, wherein the first valve and the second valve comprise a free-standing check valve.

15. The system of claim 13, wherein the first pump and the second pump comprise a bubble chamber configured to create bubbles thermally to push fluid into the third channel.

16. The system of claim 13, wherein the first pump and the second pump comprise a bubble chamber configured to create bubbles electrolytically to push fluid into the third channel.

17. The system of claim 11, wherein the first mechanism and the second mechanism operate to vary duty cycles of the first pulses and the second pulses.

18. The system of claim 11, wherein the first mechanism and the second mechanism operate to vary a phase difference between the first pulses and the second pulses.

19. A micro-electromechanical system, comprising:
   a first channel configured to carry the first fluid;
   a first mechanism configured to create first pulses in the first fluid;
   a second channel configured to carry a second fluid;
   a second mechanism configured to create second pulses in the second fluid; and
   a third channel coupled to the first channel and the second channel, wherein the first fluid and the second fluid mix in the third channel to form a mixed fluid as the first and second fluids travel through the third channel to an exit of the third channel so as to continuously form the mixed fluid, and wherein the first pulses and the second pulses distort an interface between the first fluid and the second fluid to facilitate diffusion between the first fluid and the second fluid.

20. The system of claim 19, wherein the first mechanism comprises:
   a first pump configured to push the first stream of fluid into the third channel; and
   a first valve positioned between the first pump and the third channel and configured to alternately open and close to permit fluid flow across the first valve into the third channel when the first valve is open and prevent fluid flow across the first valve when the first valve is closed.

21. The system of claim 20, wherein the second mechanism comprises:

a second pump configured to push the second stream of fluid into the third channel; and
   a second valve positioned between the second pump and the third channel and configured to operate synchronously with the first valve to alternately close and open to permit fluid flow across the second valve when the first valve is closed and prevent fluid flow across the second valve when the first valve is open.

22. The system of claim 21, wherein the first valve and the second valve comprise a free-standing check valve.

23. The system of claim 21, wherein the first pump and the second pump comprise a bubble chamber configured to create bubbles thermally to push fluid into the third channel.

24. The system of claim 21, wherein the first pump and the second pump comprise a bubble chamber configured to create bubbles electrolytically to push fluid into the third channel.

25. The system of claim 21, wherein the first pump and the second pump operate to vary a flow rate of the mixed fluid.

26. The system of claim 21, wherein the first pump and the second pump operate to vary a ratio of the first fluid and the second fluid in the mixed fluid.

27. In a micro-electromechanical system, a mechanism for performing continuous laminar fluid mixing, comprising:
   means for producing first pulses in a first stream of fluid;
   means for creating second pulses in a second stream of fluid; and
   means for merging the first stream and the second stream as the first and second streams travel through the third channel to an exit of the third channel so as to continuously form a third stream of fluid, wherein the first pulses and the second pulses distort an interface between the first stream and the second stream to facilitate diffusion across the interface.

28. The mechanism of claim 27, wherein the means for producing and the means for creating comprise means for forming bubbles to produce pulsed fluid motion.

29. The mechanism of claim 28, wherein the means for forming comprises means for thermally forming bubbles.

30. The mechanism of claim 28, wherein the means for forming comprises means for electrolytically forming bubbles.

31. The mechanism of claim 29, wherein the means for producing comprises means for regulating fluid flow of the first fluid and wherein the means for creating comprises means for regulating fluid flow of the second fluid.

* * * * *